(12) United States Patent
Ponoth et al.

(10) Patent No.: US 8,703,604 B2
(45) Date of Patent: Apr. 22, 2014

(54) CREATION OF VIAS AND TRENCHES WITH DIFFERENT DEPTHS

(75) Inventors: Shom Ponoth, Albany, NY (US); David V. Horak, Essex Junction, VT (US); Takeshi Nogami, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/415,164

(22) Filed: Mar. 8, 2012

(65) Prior Publication Data

US 2012/0171859 A1 Jul. 5, 2012

Related U.S. Application Data

(63) Continuation of application No. 12/610,624, filed on Nov. 2, 2009, now Pat. No. 8,227,339.

(51) Int. Cl.
*H01L 21/311* (2006.01)
*H01L 21/3065* (2006.01)

(52) U.S. Cl.
USPC ........... 438/638; 438/427; 438/637; 438/734; 438/740; 257/E21.548

(58) Field of Classification Search
USPC ......... 438/637–638, 424, 427, 700, 734–742; 257/E21.548
See application file for complete search history.

(56) References Cited

U.S. PATENT DOCUMENTS

| | | | |
|---|---|---|---|
| 4,832,789 A | | 5/1989 | Cochran et al. |
| 5,397,731 A | * | 3/1995 | Takemura ..................... 438/427 |
| 6,001,414 A | * | 12/1999 | Huang et al. .................. 438/622 |
| 6,057,227 A | * | 5/2000 | Harvey .......................... 438/626 |
| 6,093,632 A | * | 7/2000 | Lin ................................ 438/618 |
| 6,103,619 A | * | 8/2000 | Lai ................................ 438/638 |

(Continued)

FOREIGN PATENT DOCUMENTS

| | | |
|---|---|---|
| JP | 2003100864 | 4/2003 |
| JP | 2004241620 | 8/2004 |
| JP | 2007019187 | 1/2007 |
| JP | 2008277859 | 11/2008 |

OTHER PUBLICATIONS

Chao et al., "Dual Damascene BEOL processing using multilevel step and flash imprint lithograhpy", Society Optical Engineering, The University of Texas at Austin, TX, pp. 1-14.

(Continued)

*Primary Examiner* — Laura Menz
*Assistant Examiner* — Maliheh Malek
(74) *Attorney, Agent, or Firm* — Yuanmin Cai

(57) ABSTRACT

Embodiments of the invention provide a method of creating vias and trenches with different length. The method includes depositing a plurality of dielectric layers on top of a semiconductor structure with the plurality of dielectric layers being separated by at least one etch-stop layer; creating multiple openings from a top surface of the plurality of dielectric layers down into the plurality of dielectric layers by a non-selective etching process, wherein at least one of the multiple openings has a depth below the etch-step layer; and continuing etching the multiple openings by a selective etching process until one or more openings of the multiple openings that are above the etch-stop layer reach and expose the etch-stop layer. Semiconductor structures made thereby are also provided.

13 Claims, 7 Drawing Sheets

(56) References Cited

U.S. PATENT DOCUMENTS

| | | | |
|---|---|---|---|
| 6,207,534 B1 | 3/2001 | Chan et al. | |
| 6,221,759 B1 | 4/2001 | Bothra et al. | |
| 6,225,207 B1* | 5/2001 | Parikh | 438/622 |
| 6,265,780 B1* | 7/2001 | Yew et al. | 257/759 |
| 6,268,278 B1 | 7/2001 | Eimori et al. | |
| 6,284,642 B1* | 9/2001 | Liu et al. | 438/622 |
| 6,294,423 B1 | 9/2001 | Malik et al. | |
| 6,399,495 B1* | 6/2002 | Tseng et al. | 438/687 |
| 6,399,502 B1 | 6/2002 | Hernandez et al. | |
| 6,458,494 B2 | 10/2002 | Song et al. | |
| 6,498,092 B2* | 12/2002 | Lee et al. | 438/634 |
| 6,582,974 B2* | 6/2003 | Lui et al. | 438/6 |
| 6,593,223 B1* | 7/2003 | Huang et al. | 438/618 |
| 6,596,608 B2 | 7/2003 | Saito | |
| 6,656,815 B2 | 12/2003 | Coolbaugh et al. | |
| 6,667,222 B1 | 12/2003 | Su et al. | |
| 6,897,159 B1 | 5/2005 | Lee et al. | |
| 6,932,916 B2* | 8/2005 | Manger et al. | 216/62 |
| 6,940,170 B2* | 9/2005 | Parikh | 257/750 |
| 6,949,801 B2 | 9/2005 | Parat et al. | |
| 6,995,095 B2 | 2/2006 | Yu | |
| 7,187,015 B2* | 3/2007 | Tsau | 257/211 |
| 7,271,060 B2 | 9/2007 | Sandhu et al. | |
| 7,279,376 B2 | 10/2007 | Otsuki | |
| 7,361,992 B2* | 4/2008 | Matsubara et al. | 257/758 |
| 7,371,684 B2 | 5/2008 | Colburn et al. | |
| 7,396,475 B2 | 7/2008 | Sreenivasan | |
| 7,427,552 B2 | 9/2008 | Jin et al. | |
| 7,445,159 B2 | 11/2008 | Tzu et al. | |
| 7,456,110 B2 | 11/2008 | Lansford et al. | |
| 7,468,302 B2 | 12/2008 | Shin | |
| 7,470,616 B1 | 12/2008 | Akinmade-Yusuff et al. | |
| 7,670,907 B2 | 3/2010 | Korber | |
| 7,682,956 B2 | 3/2010 | Rao et al. | |
| 7,786,017 B1 | 8/2010 | Morgenfeld et al. | |
| 7,811,935 B2 | 10/2010 | Sandhu | |
| 7,935,602 B2 | 5/2011 | Wang et al. | |
| 8,367,544 B2* | 2/2013 | Cheng et al. | 438/672 |
| 2002/0164881 A1 | 11/2002 | Nambu | |
| 2003/0024902 A1 | 2/2003 | Li et al. | |
| 2003/0207594 A1 | 11/2003 | Catabay et al. | |
| 2003/0211702 A1 | 11/2003 | Parat et al. | |
| 2004/0023499 A1* | 2/2004 | Hellig et al. | 438/694 |
| 2004/0029385 A1 | 2/2004 | Manger et al. | |
| 2004/0058508 A1 | 3/2004 | Parat et al. | |
| 2004/0241984 A1 | 12/2004 | Schwan et al. | |
| 2005/0079722 A1* | 4/2005 | Yu | 438/706 |
| 2005/0093158 A1 | 5/2005 | Liu et al. | |
| 2005/0106871 A1 | 5/2005 | Yu | |
| 2005/0167839 A1 | 8/2005 | Wetzel et al. | |
| 2005/0239002 A1 | 10/2005 | Li | |
| 2005/0282395 A1 | 12/2005 | Chang et al. | |
| 2006/0063392 A1 | 3/2006 | Ventzek et al. | |
| 2006/0170058 A1 | 8/2006 | Chiang et al. | |
| 2007/0111467 A1* | 5/2007 | Kim | 438/424 |
| 2007/0190718 A1 | 8/2007 | Coolbaugh et al. | |
| 2007/0205414 A1 | 9/2007 | Chang et al. | |
| 2008/0003798 A1 | 1/2008 | Hwang | |
| 2008/0166888 A1 | 7/2008 | Hsu et al. | |
| 2008/0194114 A1 | 8/2008 | Yoshida | |
| 2008/0203455 A1 | 8/2008 | Jang et al. | |
| 2008/0206956 A1 | 8/2008 | Matsuda | |
| 2008/0217653 A1* | 9/2008 | Sonsky | 257/190 |
| 2009/0189242 A1 | 7/2009 | Costrini et al. | |
| 2009/0194845 A1 | 8/2009 | Werner et al. | |
| 2009/0236684 A1 | 9/2009 | Lee | |
| 2009/0256242 A1 | 10/2009 | Parikh et al. | |
| 2009/0261479 A1 | 10/2009 | Hong | |
| 2010/0003825 A1 | 1/2010 | Ogasawara et al. | |
| 2010/0013515 A1 | 1/2010 | Jung | |
| 2010/0022084 A1* | 1/2010 | Chen et al. | 438/637 |
| 2010/0173470 A1 | 7/2010 | Lee et al. | |
| 2010/0285646 A1 | 11/2010 | Lin et al. | |
| 2010/0327412 A1 | 12/2010 | Lee et al. | |
| 2011/0014771 A1 | 1/2011 | Dunton et al. | |
| 2011/0079918 A1 | 4/2011 | Zhou et al. | |

OTHER PUBLICATIONS

Office Action dated Feb. 29, 2012, U.S. Appl. No. 12/610,624, filed Nov. 2, 2009.

\* cited by examiner

CREATION OF VIAS AND TRENCHES WITH DIFFERENT DEPTHS

CROSS-REFERENCE TO RELATED APPLICATION

This application is a continuation application of U.S. patent application Ser. No. 12/610,624, filed Nov. 2, 2009, the content of which is incorporated herein by reference in its entirety.

FIELD OF THE INVENTION

The present invention relates generally to the field of semiconductor device manufacturing and in particular relates to method of creating vias and trenches of different depths.

BACKGROUND OF THE INVENTION

In the field of semiconductor device manufacturing, various semiconductor devices such as, for example, transistors are manufactured through processes commonly known as front end of line (FEOL) technologies. A transistor may be, for example, a field-effect-transistor (FET) and may be more specifically a complementary metal-oxide-semiconductor (CMOS) FET or CMOS-FET. In addition, a CMOS-FET may be a p-type dopant doped CMOS-FET (PFET) or an n-type dopant doped CMOS-FET (NFET). Different types of transistors, including FETs and/or CMOS-FETs, may be manufactured or formed on a common semiconductor substrate or semiconductor chip.

Following the formation of various types of semiconductor devices, interconnect structures for electrical connections of the various types of semiconductor devices may be made or formed on top thereof thereby the semiconductor devices may operate and/or interoperate properly to together provide functions that they are designed for. Interconnects for electrical connections may include different types of vias and/or trenches (lines). Interconnects provide electrical connections between, for example, a gate and a source (or a drain) of a transistor and/or among different contact locations of different transistors and/or other active and passive devices. Conventionally, vias and trenches are made, for example, through processes commonly known as back end of line (BEOL) technologies and are usually made in separate processes due to their unique requirement of, for example, different sizes and depths. On the other hand, making vias and trenches in separate processes is not only time-consuming, but also increases the cost and complexity of the overall process.

SUMMARY OF THE INVENTION

Embodiment of the invention provides a method of manufacturing vias and trenches of different depths. The method includes depositing a plurality of dielectric layers on top of a semiconductor structure, the plurality of dielectric layers being separated by at least one etch-stop layer; creating multiple openings from a top surface of the plurality of dielectric layers down into the plurality of dielectric layers by a non-selective etching process, wherein at least one of the multiple openings has a depth below the etch-step layer; and continuing etching the multiple openings by a selective etching process until one or more openings of the multiple openings that are above the etch-stop layer reach and expose the etch-stop layer.

In one embodiment, the etch-stop layer is a first etch-stop layer; the plurality of dielectric layers are further separated by a second etch-stop layer that is separated from and underneath the first etch-stop layer; and the at least one of the multiple openings is a first opening. The method further includes creating a second opening of the multiple openings that has a depth below the second etch-stop layer.

In one embodiment, the continuing etching of the multiple openings includes etching the multiple openings by the selective etching process until the first opening of the multiple openings exposes the second etch-stop layer.

In another embodiment, the semiconductor structure is an interconnect structure of a semiconductor device having a conductive stud, and wherein the continuing etching of the multiple openings includes etching the multiple openings by the selective etching process until the second opening of the multiple openings exposes the conductive stud.

In yet another embodiment, the method further include filling in the second opening of the multiple openings with a conductive material thereby forming a conductive via, the conductive via being in contact with the conductive stud of the semiconductor device.

A semiconductor structure made by the method above is also provided. In particular, the semiconductor structure may be an interconnect structure, and may include a semiconductor structure on top of a semiconductor substrate; a plurality of dielectric layers on top of the semiconductor structure and being separated by at least one etch-stop layer; at least one via or trench, inside the plurality of dielectric layers, having a depth below the etch-stop layer; and one or more trenches, inside the plurality of dielectric layers, whose depth are defined by the etch-stop layer.

BRIEF DESCRIPTION OF THE DRAWINGS

The present invention will be understood and appreciated more fully from the following detailed description of the invention, taken in conjunction with the accompanying drawings of which.

Figure 1A:
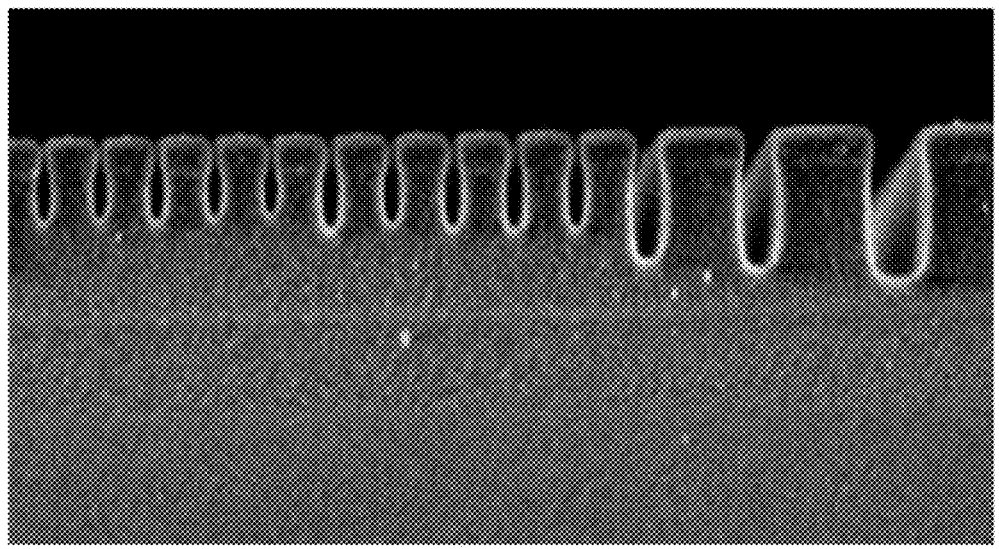
FIG. 1A is a sample SEM picture demonstrating relationship between depth and width of vias made through a reactive-ion-etching (RIE) process.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIG. 1A is a sample SEM picture illustrating relationship between depth and width of various openings made in a dielectric material through a reactive-ion-etching process. Reactive-ion-etching (RIE) process is commonly used, as one of many BEOL processes, in creating conductive vias and/or trenches for the purpose of interconnecting semiconductor devices. However, as a phenomenon of RIE lag, which is commonly known in the art, depths of the openings (which may be subsequently made into vias or trenches after being filled with conductive materials) created through the RIE process generally depend upon the size, in particular the lateral size or width, of the openings. For example, in a "positive" RIE lag situation as is illustrated in FIG. 1A, the wider the opening is, usually the deeper the opening is made into the dielectric layer.

Figure 1B:
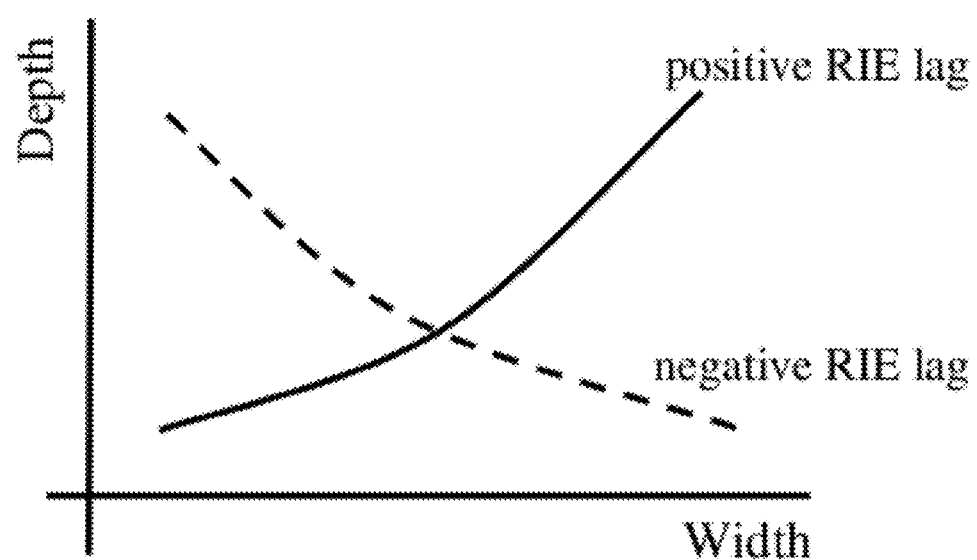
FIG. 1B is a conceptual illustration of positive RIE lag and negative RIE lag.

FIG. 1B is a conceptual illustration of two types of RIE lags: positive RIE lag and negative RIE lag which depend upon etching conditions and the type of etchant used. In a RIE etching process with positive RIE lag (solid line), a deeper etching is normally achieved with a wider opening. When the opening becomes narrower, the depth of etching becomes shallow, which is the cases being illustrated above in FIG. 1A. In a negative RIE lag etching condition (dash line), the opposite happens. That is, etching in a narrow opening generally goes deeper into the material than etching of a wide opening. Nevertheless, in the following detailed description of embodiments of the present invention, examples will be presented most of the time on positive RIE lag situations. A person skilled in the art shall understand that the essence of present invention, including numerous embodiments, may be similarly applied to negative RIE lag situations.

Figure 2A:
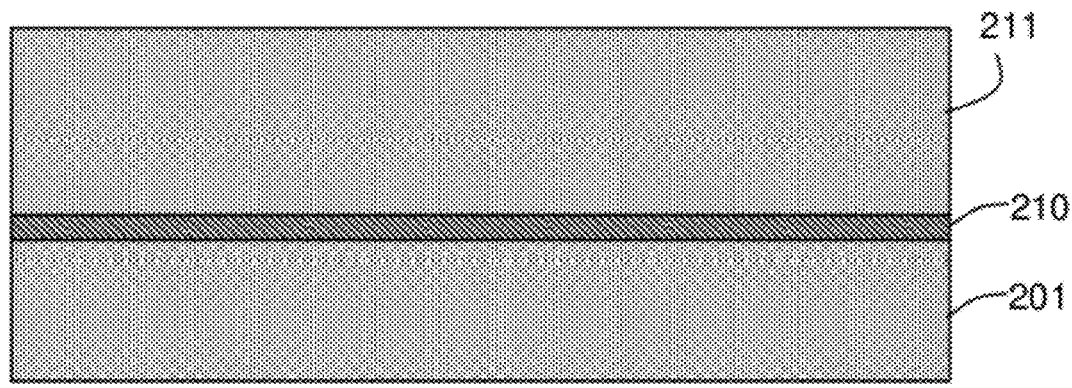
FIGS. 2A-2B are demonstrative illustrations of the effect of RIE lag on etching depth of vias and trenches.
Figure 2B:
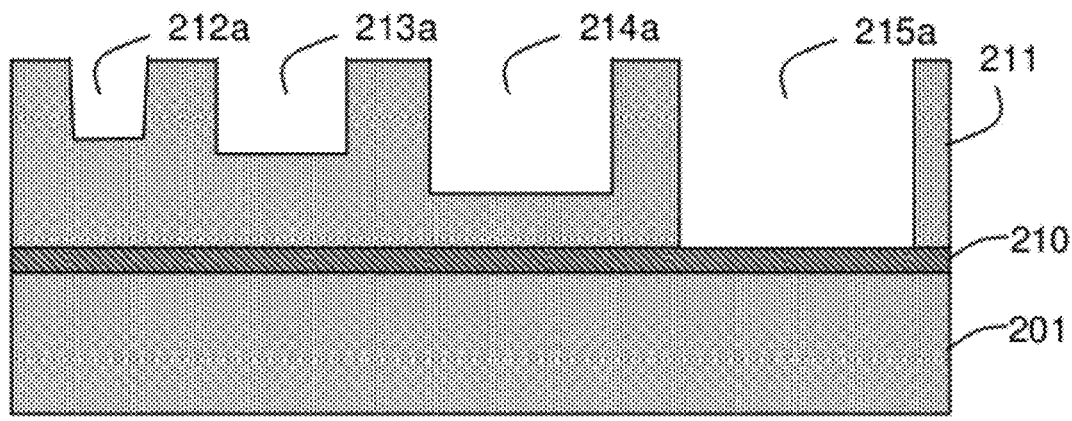

FIGS. 2A-2B are demonstrative illustrations of the effect of positive RIE lag on the creation of vias and trenches in a conventional process. For example in FIG. 2A, a semiconductor structure 201 is illustrated, in a cross-section view, that may be for example a semiconductor device, or an interconnect structure or part thereof, of a semiconductor device. A capping layer 210 may be formed on top of semiconductor structure 201 and on top of capping layer 210 a dielectric layer 211 may be formed. The formation of capping layer 210 and dielectric layer 211 may be made through any conventional processes such as, for example, a deposition process. Next, various types of vias and trenches are to be formed inside dielectric layer 211 for purpose of device interconnection.

In order to create or form vias and trenches inside dielectric layer 211, in a trench-first via-second conventional approach, shapes of various trenches may first be patterned on top of dielectric layer 211. The trench patterns may be formed in a photo-resist layer (not shown) through a photo-lithographic process, as is commonly known in the art, and be subsequently transferred or copied down into the underlying dielectric layer 211 through an etching process such as a reactive-ion-etching process. As a result, trench openings of for example 212a, 213a, and 214a, as being illustrated in FIG. 2B, may be created inside dielectric layer 211 that may next be made into trenches or conductive lines for device interconnection.

However, due to RIE lag effect, trench openings 212a, 213a, and 214a may be made of having different depths due to their different widths of lines. For example, in a positive RIE lag etching environment, when openings 212a, 213a, and 214a are simultaneously subjected to a same etching process, opening 214a (which has the widest width among openings 212a, 213a, and 214a) may have a deeper depth than that of openings 212a and 213a. Similarly opening 213a (which has a width wider than that of opening 212a) may have a depth deeper than that of openings 212a. It is observed that different depths of trench openings are generally not desirable since interconnect of conductive lines at different levels is difficult to handle and requires bigger real estate footprint at least in the direction of depth.

Following the formation of trench openings 212a, 213a, and 214a, openings for vias may be formed (trench-first via-second). Various via openings may first be created and subsequently be filled with conductive materials to be made into conductive vias that connect to interconnect structures of different levels such as for example those underneath dielectric layer 211. Conventionally, via openings are created in a process that is separate from the above process of creating trench openings. This is partially because etching conditions for creating via openings (or via holes) are generally different from those for creating trench openings due to for example their distinctively different depth requirement. In other words, the conventional process of creating via openings is not compatible with that for creating trench openings and therefore the two processes are normally performed separately. On the other hand, the steps of creating via openings may be similar in process to those of creating trench openings. For example, via patterns may be created first in a photo-resist and the via patterns may be transferred to the underlying dielectric layer 211 through a RIE etching process to create for example via opening (or via hole) 215a.

Alternatively, vias and trenches may be created in a via-first trench-second approach, as is also known in the art, where trenches openings are formed following the formation of via holes. The use of two separate processes in creating via openings and trench openings, in either the trench-first via-second approach or the via-first trench-second approach, are generally considered as complex and time consuming. For example, it may be necessary to align photo-resist masks used in the two separate processes of creating trench and via patterns in order for the interconnect structure to work properly.

Figure 2C:
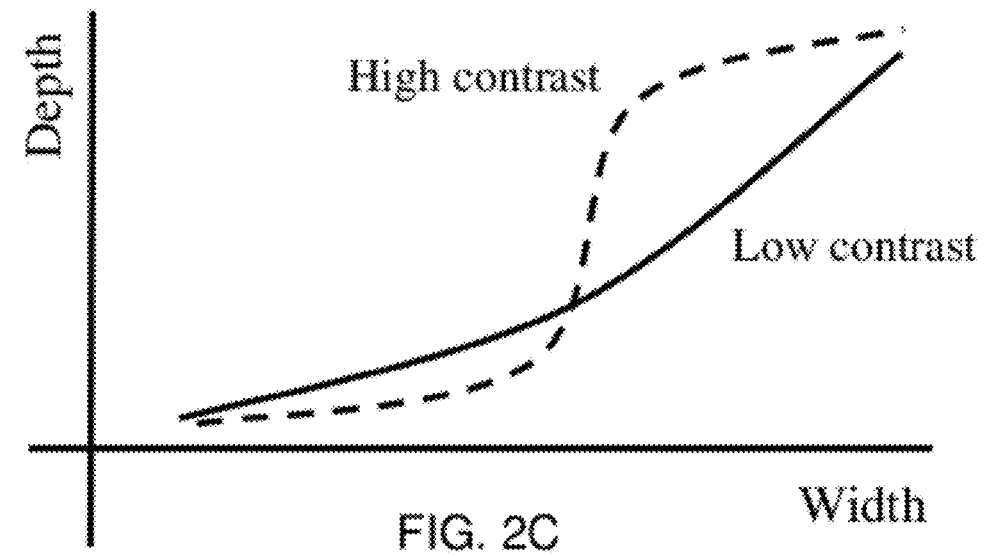
FIG. 2C is a conceptual illustration of via contrast.

FIG. 2C is a conceptual illustration of via contrast. In a low contrast situation (solid line), the depth of openings (y-axis) changes gradually with the change of width of the openings, which may be created for vias or trenches, and there is not a distinct region of width around where the depth of openings changes dramatically with the change of width. In other words, there is no such a distinct region which when the width of openings goes across the depth of openings becomes significantly deeper or shallower.

As is known in the art, interconnect structures may generally include trenches and vias that have variations of width and/or size for different purposes. For example, trenches of different widths are preferably formed and sometimes required to be formed at approximately the same depth, therefore having the same contrast, in order for them to interact properly and/or function efficiently. In addition, in order to form vias that are normally at a distinctive different depth (usually sufficiently deep for contacting interconnect structures underneath thereof) therefore a high contrast from trench openings, separate processes are normally used that may involve different RIE etch conditions for via openings and for trench openings. On the other hand, similar to trench openings as being described above, via openings are also required to be formed to have substantially the same depth in order to reach the same next level of interconnect. However, the existence of RIE lags, either positive or negative, may pose difficulty in achieving the same depths of via openings of different sizes in the conventional method.

Figure 3A:
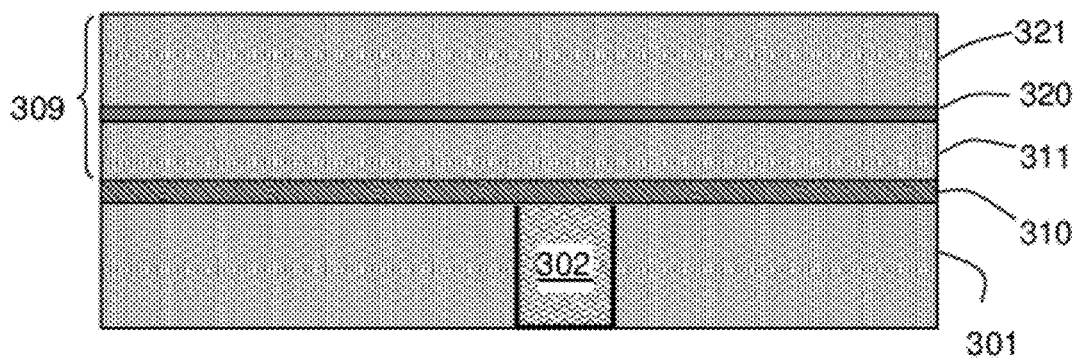
FIGS. 3A-3C are demonstrative illustrations of a method of forming vias and trenches of different depths in a semiconductor material according to one embodiment of the invention.
Figure 3B:
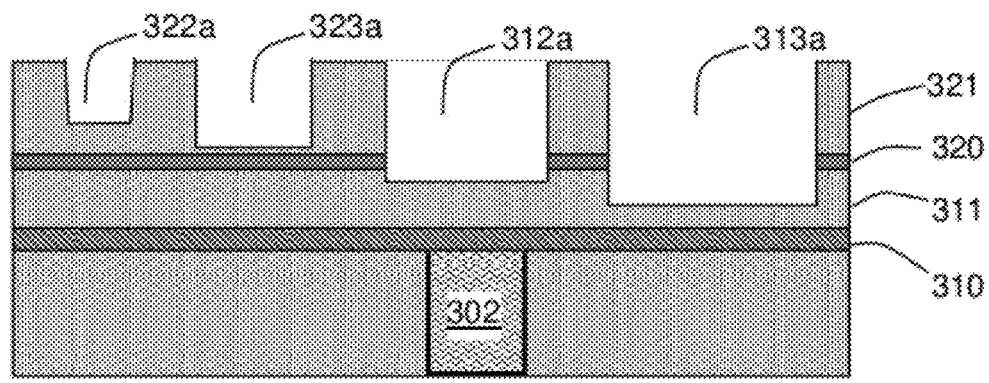
Figure 3C:
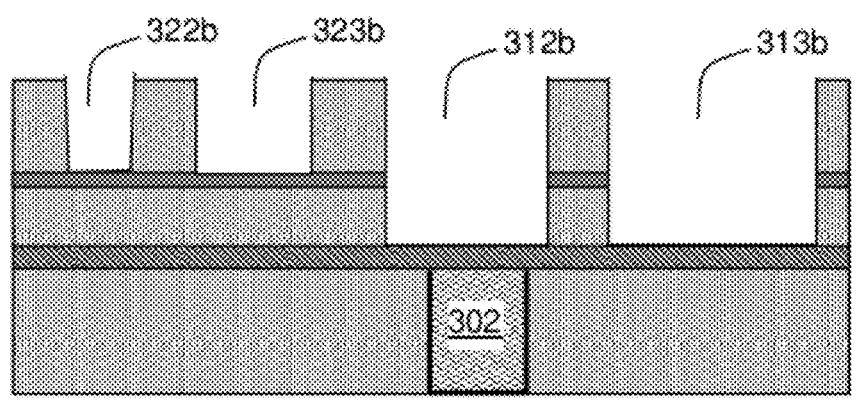

FIGS. 3A-3C are demonstrative illustrations of a method of forming vias and trenches of different depths in a semiconductor material according to one embodiment of the invention. For example, the method may start with a semiconductor structure 301 inside which some interconnect structures such as, for example, a conductive stud 302 may already be formed. In a next step, the method may include forming a capping layer 310 on top of semiconductor structure 301. Capping layer 310 may be made of SiN, SiCN, or other dielectric materials. Capping layer 310 may be deposited to have a thickness between 5 nm and 100 nm such that it may serve to isolate the two metallization levels properly, above and below thereof, and provide a barrier function to oxygen and copper diffusion.

Next, according to one embodiment of the present invention, the method may include forming or depositing a plurality of dielectric layers 309 on top of capping layer 310. The plurality of dielectric layers 309 may be separated by one or more etch-stop layers. For example, dielectric layers 311 and 321 may be formed on top of capping layer 310 and may be separated by at least one etch-stop layer 320. Etch-stop layer 320 may be preferably made of a material different from the materials of dielectric layers 311 and 321, such that selective etching processes may be designed and employed to etch only dielectric layers 311 and 321 but not etch-stop layer 320, or vise versus. In the meantime, with materials of dielectric layers 311 and 321 and etch-stop layer 320 being carefully chosen, a non-selective etching process may also be designed and used in etching both dielectric layers 311 and 321 and etch-stop layer 320. For example and more specifically, etch-stop layer 320 may be made of amorphous carbon material and dielectric layers 311 and 321 may be made of SiCOH to achieve the above purpose. However, embodiments of the present invention may not be limited in this respect, and a person skilled in the art will appreciate that other materials may be used as etch-stop layer and/or as dielectric layers so long as both selective and non-selective etching processes may be made available, and used in the subsequent steps in creating via and trench openings. For example, when dielectric layers 311 and 321 are porous low-k dielectric materials, etch-stop layer 320 may be a thin layer of silicon oxide. More details are described below.

Following the formation of plurality of dielectric layers such as dielectric layer 311 and 321, a mask (not shown) in the form of photo-resist material or hard mask may be formed on top of dielectric layer 321 using conventional photolithographic process and/or hard mask stack system. The pattern in the mask may define shape and size of both vias and trenches to be formed inside the plurality of dielectric layers 309, which is different from a conventional mask which usually includes either via or trench patterns since via and trench are conventionally made in two separate processes.

According to embodiments of the present invention, the method may further include etching the plurality of dielectric layers 311 and 321 through the mask in a non-selective etching process. In other words, the method includes transferring or copying via and trench patterns in the mask, at least partially, to the plurality of dielectric layers 311 and/or 321 through a non-selective process. The non-selective etching process may be a reactive-ion-etching (RIE) process, although embodiment of the invention may not be limited in this respect, and the RIE etching process may employ gases such as $CF_4$ and $O_2$. Other types of gases or combination of gases may be used as well so long as they provide a non-selective etching to both dielectric layers 311 and 321 and etch-stop layer 320.

In one embodiment, assuming positive RIE lag effect during the etching, openings 322a and 323a, which have relatively narrow width as is illustrated in FIG. 3B, may be formed above etch-stop layer 320 and openings 312a and 313a, which have relatively wide width, may be formed to have a depth that is beyond the etch-stop layer 320. In other words, etch-stop layer 320 may be etched away in openings 312a and 313a but not in openings 322a and 323a. In another embodiment of negative RIE lag etching environment, openings of narrow width such as 322a and 323a may be etched to have a depth beyond etch-stop layer 320 while openings of wide width such as 312a and 313a may remain above etch-stop layer 320.

Figure 7:
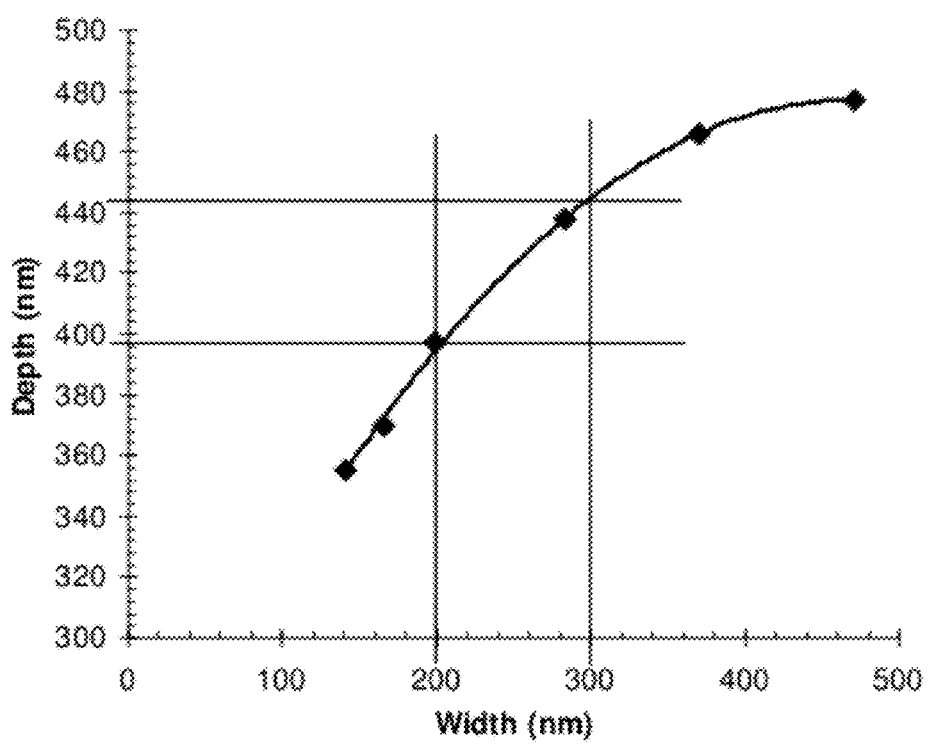
FIG. 7 is a sample test result showing depth versus width RIE etching rate for vias and trenches.

According to one embodiment, thickness of dielectric layer 321 may be designed or formed such that etching of vias and/or trenches with certain width of openings may be controlled to stop either before or beyond the etch-stop layer 320. This may be accomplished by calibrating the etching rate, depth versus width, for the particular dielectric material 321 and design the thickness of dielectric layer 321 and width of the various openings accordingly. FIG. 7 is a sample test result showing depth versus width of openings made during a RIE etching process for a duration of approximately 60 seconds. Based upon FIG. 7, for example, if dielectric layer 321 is made to have a thickness around 420 nm, for trenches that are desired to stay above etch-stop layer 320, openings with a width less than approximately 200 nm may be used such that depths of these openings may be made to be less than 400 nm. In the meantime, for vias that are supposed to go beyond the etch-stop layer 320 (and continue to etch through dielectric layer 311), then openings of the vias may be made to have at least a width larger than 300 nm. Under this condition, depths of these via openings may have a depth larger than 440 nm, deeper than the thickness of dielectric layer 321 of 420 nm.

Following the non-selective etching process and after openings 312a and 313a have reached beyond etch-stop layer 320, method of the present invention may include continuing etching openings 322a, 323a, 312a, and 313a in a selective-etching process. The selective-etching process may etch dielectric layers 321 and 311 but may not etch or substantially etch etch-stop layer 320. Additionally, the selective-etching process may also be selective to capping layer 310, depending on the material being used for capping layer 310. However, selectivity to capping layer 310 is optional and may not be always necessary. For example, in one embodiment, the selective-etching process may etch capping layer 310 as well and therefore may expose conductive stud 302 underneath thereof.

For openings 322a and 323a, the selective-etching process may stop at etch-stop layer 320, and for openings 312a and 313a, the selective-etching process may stop at capping layer 310, thus creating openings 322b, 323b, 312b, and 313b as being illustrated in FIG. 3C. Following the creation of openings 322b, 323b, 312b, and 313b, capping layer 310 at the bottom of opening 312b may be removed if it still remains and was not removed in a previous step. The removal of capping layer 310 may be made through preferably a selective etching process although a non-selective etching process may work as well. In case of a non-selective etching process is used, some or all of etch-stop layer 320 exposed inside trench openings 322b and 323b may be etched away. However, since generally capping layer 310 is thin compared to the depth of the trench openings or via holes, the etching of etch-stop layer 320 (made during the removal of capping layer 310) or even a little bit punch-through inside trench openings 322b and 323b may not be severe and therefore may be generally acceptable. Openings 322b, 323b, 312b, and 313b may subsequently be filled up with conductive material to finish forming vias and/or trenches. In one embodiment, the semiconductor structure 301 has a substantially flat top surface and top surface of dielectric layer 321 is substantially flat as well, although embodiments of the present invention are not limited in this aspect of having a flat top surface. For example, top surface of semiconductor structure 301 may have a certain topography shape and dielectric layers 309 may be a conformal layer or a stack of conformal layers on top of semiconductor structure 301.

Figure 4A:
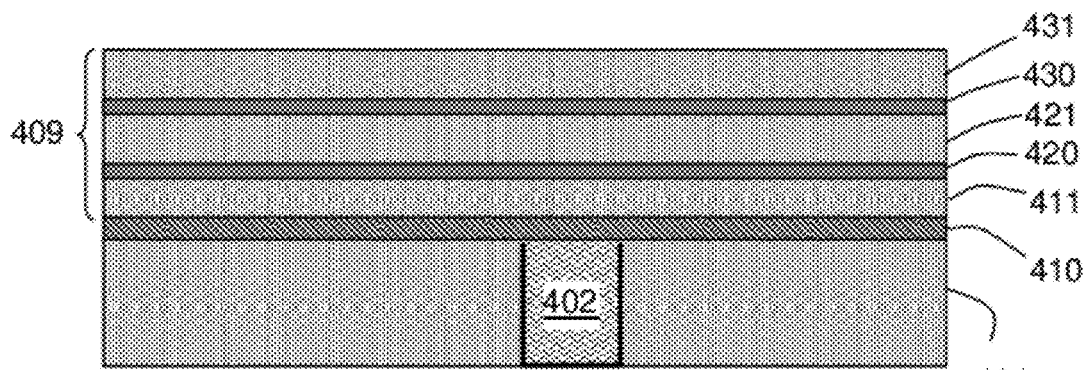
FIGS. 4A-4C are demonstrative illustrations of a method of forming vias and trenches of different depths in a semiconductor material according to another embodiment of the invention.
Figure 4B:
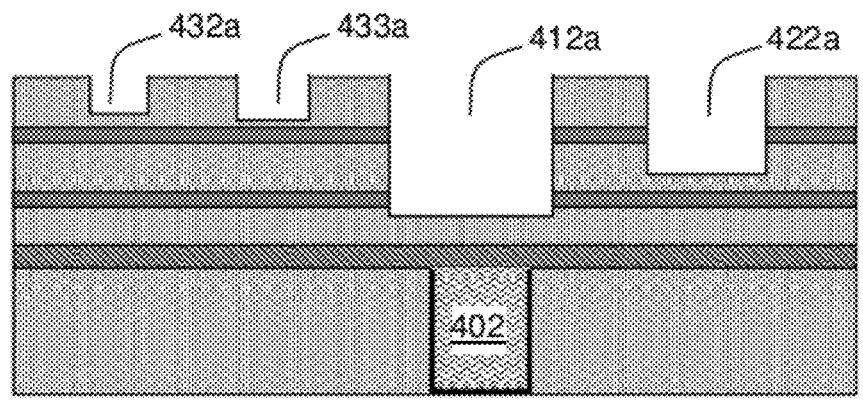
Figure 4C:
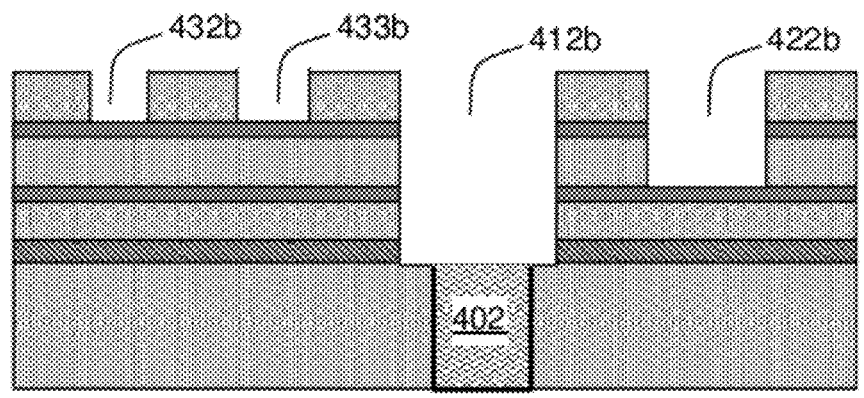

FIGS. 4A-4C are demonstrative illustrations of a method of forming vias and trenches of different depths in a semiconductor material according to another embodiment of the invention. For example, the method may start with a semiconductor structure 401 having formed inside thereof one or more conductive vias, for example, via 402. The method may include forming a capping layer 410 on top of semiconductor structure 401, and multiple dielectric layers 411, 421, and 431 on top of capping layer 410. Dielectric layers 411 and 421 may be separated by etch-stop layer 420, and dielectric layers 421 and 431 may be separated by etch-stop layer 430. According to one embodiment of the present invention, the number of etch-stop layers used may be dependent upon the number of distinct depth levels that are needed in the multiple dielectric layers. In one embodiment, the semiconductor structure 401 has a substantially flat top surface and top surface of dielectric layer 431 is substantially flat as well, although embodiments of the present invention are not limited in this aspect.

Following the formation, the method may include etching the plurality of dielectric layers 409, including layer 411, 421, and 431 in a non-selective etching process. Conditions of the etching process and the width and/or size of different openings may be designed and/or carefully controlled such that opening 412a may have a depth below the level of etch-stop layer 420; opening 422a may have a depth below etch-stop layer 430 but above etch-stop layer 420, and openings 432a and 433a may have a depth above etch-stop layer 430. For example, the duration of etching process and width or size of the respective openings may be designed based upon a pre-calibrated etching rate such as the one shown in FIG. 7. In one embodiment, openings 432a, 433a, 412a, and 422a (when eventually being created according to design as 432b, 433b, 412b, and 422b) may have distinct depth levels that are defined or controlled by the respective etch-stop layers 420 and 430.

Following the non-selective etching process in creating openings 432a, 433a, 412a, and 422a, the method may include continuing etching openings 432a, 433a, 412a, and 422a with a selective etching process until openings 432a and 433a become openings 432b and 433b exposing etch-stop layer 430; opening 422a becomes opening 422b exposing etch-stop layer 420; and opening 412a becomes opening 412b, as being illustrated in FIG. 4C. Capping layer 410 may be etched away during the above selective etching process, depending on the materials of capping layer, or may be etched away separately by employing another selective etching process. Opening 412b may be etched until it expose via 402 inside semiconductor structure 401.

After the creation of openings 432b, 433b, 412b, and 422b, the openings may be filled with conductive materials for forming vias and trenches by employing techniques well known in the art. For example, opening 412b may be formed into a via that is in contact with via 402 in the underneath semiconductor structure while opening 422b may be formed into a trench, for example, at a first level and openings 432b and 433b may be formed into trenches at a second level different from the first level to provide certain connectivity and/or functionality. Multiple levels of trenches may be formed.

Figure 5A:
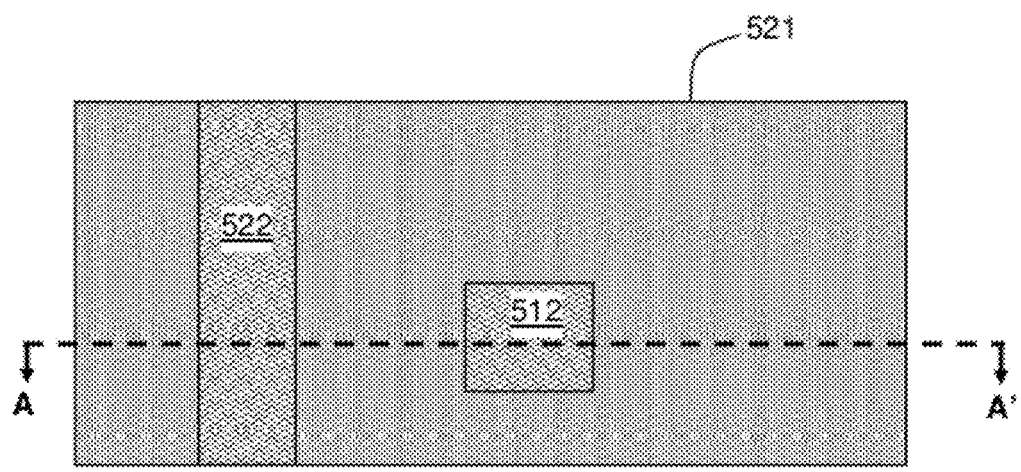
FIGS. 5A and 5B are demonstrative illustrations of top and cross-sectional views of vias and trenches manufactured according to one embodiment of the invention.
Figure 5B:
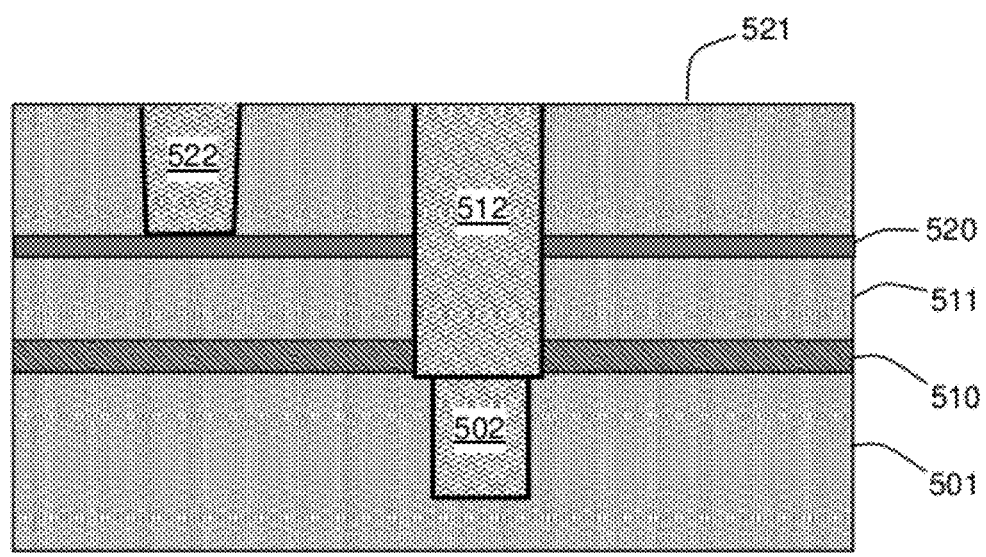

FIGS. 5A and 5B are demonstrative illustrations of top and cross-sectional views of vias and trenches used in semiconductor devices and formed according to embodiment of the present invention. For example, FIG. 5A illustrates a top view of a via 512 and a trench 522 made in the plurality of dielectric layers 511 and 521. FIG. 5B is a cross-sectional view of via 512 and trench 522, taking along a dashed line AA' in FIG. 5A. In this particular illustration, trench 522 is made within dielectric layer 521 just above etch-stop layer 520, and via 512 has a depth that reaches through dielectric layer 521, etch-stop layer 520, dielectric layer 511, and capping layer 510, and is in contact with a via 502 formed inside semiconductor structure 501 of a lower metallization level. In addition, conductive via 512 and trench 522 may be made of copper, aluminum, tungsten or other relevant metals used in semiconductor technology. The metal, especially Cu, may be used together with liners of Ta or TaN material, as is done in standard practice.

According to one embodiment of the present invention, via 512 and trench 522 have distinctive depth in the vertical direction that are defined by etch-stop layer 520 and capping layer 510. In other words and in a more general concept, vias and trenches formed according to method of the present invention may take only one of several discrete pre-determined depths that are determined by locations of the one or more etch-stop layers, regardless how many different widths the openings may have (to a certain extent of variations). This distinct feature of present invention may become even more clear when comparison is made to prior art of continuous variation in depth of the openings, where no etch-stop layer is used in the creation of via and trench openings as being illustrated in FIG. 2B.

Figure 6:
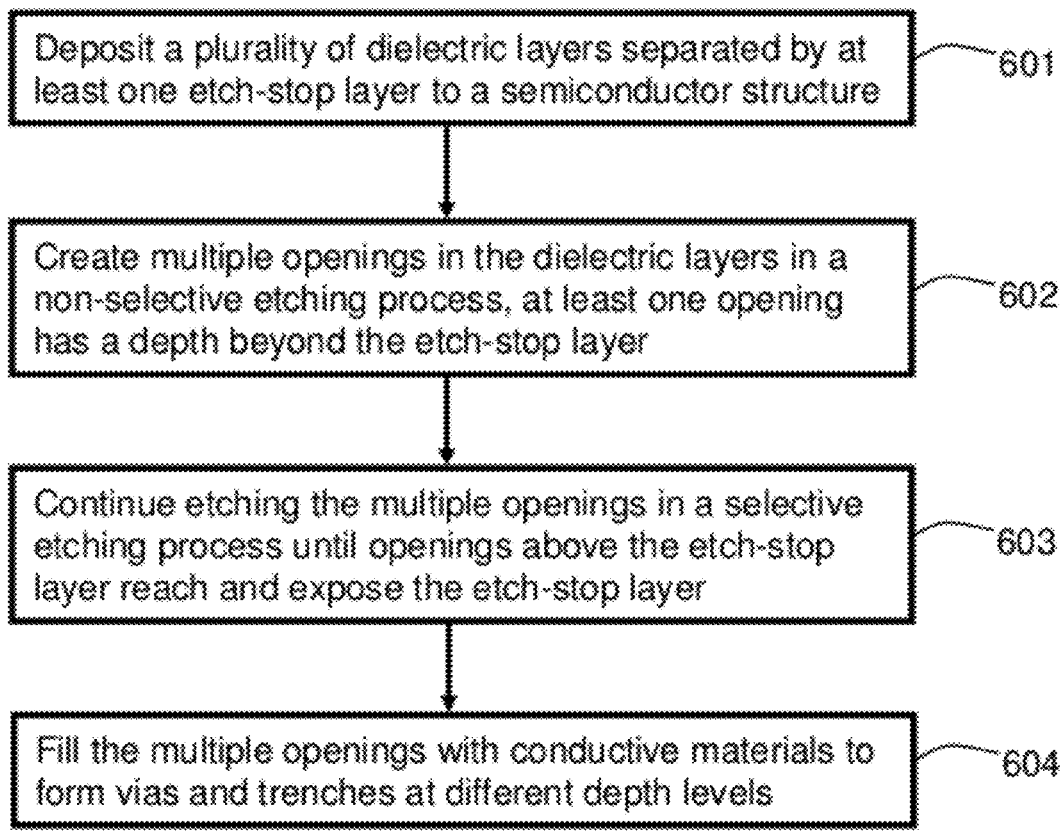
FIG. 6 is a simplified flow-chart illustration of a method of creating vias and trenches according to one embodiment of the present invention.

FIG. 6 is a simplified flow-chart illustration showing a method of creating vias and trenches openings according to one embodiment of the present invention. More specifically, the method may include depositing a plurality of dielectric layers that are separated by at least one etch-stop layer (601). For example, in one instance, the dielectric layers may be separated by two or more etch-stop layers. The dielectric layers may be formed through deposition on a semiconductor structure which may in one embodiment have a flat top surface. The semiconductor structure may be part of an interconnect structure of a semiconductor device. Following the formation of the plurality of dielectric layers, the method may include creating multiple openings in the dielectric layer(s) from a top surface thereof (602). The creation may be made through a non-selective etching process which etches both the dielectric layers and the etch-stop layer. In one embodiment, the non-selective etching process may create at least one opening which has a depth solely in the top dielectric layer without reaching the etch-stop layer, and at least another opening that has a depth that goes beyond the etch-stop layer. This may be achieved by properly designing the width of the openings together with the thickness of the dielectric layer and by taking into account of the RIE lag effect, whether positive or negative, that gives different etching depth depend on the width of the openings. Once multiple openings that pass different levels of etch-stop layer or layers have been created, the method may further continue etching the multiple openings in a selective etching process until respective openings reach and expose the respective etch-stop layers underneath thereof (603). This brings different openings, which may have different widths but within a certain range of variation, to one or several substantially same depths determined by the etch-stop layer or layers. Therefore, embodiment of the present invention enables the creation of only a limited number of depths of openings, which results in vias and trenches that may be grouped by their depths for interconnect. After the creating of openings for vias and trenches, the openings may be filled by one or more conductive materials (604) to form vias and trenches as they are designed to interact with each other, and with other levels of interconnect structures.

FIG. 7 is a sample test result showing RIE etching rate, depth versus width, made for a duration of approximately 60 seconds. The test result may be used, for example, in designing the thickness of dielectric layers and widths of various via holes and trench openings such that with the combination of a non-selective and/or a selective etching process, depths of openings with different widths may be confined by the places where different etch-stop layers may situate.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
depositing a plurality of dielectric layers on top of a semiconductor structure, said plurality of dielectric layers being separated by at least one etch-stop layer;
creating multiple openings from a top surface of said plurality of dielectric layers down into said plurality of dielectric layers by a non-selective etching process, causing at least one of said multiple openings to have a depth below said etch-step layer through a reactive-ion-etching (RIE) lag effect, where depths of the openings depend upon the lateral size of the openings; and
continuing etching said multiple openings by a selective etching process until one or more openings of said multiple openings that are above said etch-stop layer reach and expose said etch-stop layer,
wherein said at least one of said multiple openings has a uniform width, after said continuing etching said multiple openings, said uniform width being same above and below said etch-stop layer.

2. The method of claim 1, wherein said semiconductor structure is an interconnect structure of a semiconductor device having at least one conductive stud, further comprising etching said multiple openings until said at least one of said multiple openings reaches and exposes said conductive stud.

3. The method of claim 2, wherein said conductive stud is covered by a capping layer before said continuing etching, and wherein continuing said etching of said multiple openings comprises etching said capping layer by another etching process to expose said conductive stud.

4. The method of claim 3, further comprising filling in said at least one of said multiple openings with a conductive material thereby forming a conductive via, said conductive via being in contact with said conductive stud of said semiconductor device.

5. The method of claim 1, wherein said at least one of said multiple openings has a width that is wider than that of said one or more openings of said multiple openings that are above said etch-stop layer.

6. The method of claim 1, further comprising continuing etching said multiple openings by said selective etching process until said etch-stop layer is exposed by two or more openings of said multiple openings that are above said etch-stop layer.

7. The method of claim 1, further comprising filling in said one or more openings of said multiple openings with conductive materials to form one or more trenches.

8. The method of claim 1, wherein said non-selective etching process is non-selective to said etch-stop layer, and said selective etching process is selective to said etch-stop layer and does not etch said etch-stop layer.

9. The method of claim 1, wherein said plurality of dielectric layers are made of SiCOH or silicon oxide and said at least one etch-stop layer is made of amorphous carbon, and wherein said non-selective etching process is a reactive-ion-etch process employing gases of $CF_4$ and $O_2$, and wherein said selective etching process is a reactive-ion-etch process containing $CF_4$.

10. The method of claim 1, wherein said non-selective etching process is a reactive-ion-etching process having a positive etching lag, causing openings with wider width being etched deeper than openings with narrower width.

11. The method of claim 1, wherein said top of said semiconductor structure is substantially flat and wherein depositing said plurality of dielectric layers comprises making said top surface of said plurality of dielectric layers to be substantially flat.

12. A method comprising:
depositing a plurality of dielectric layers on top of a semiconductor structure, said plurality of dielectric layers being separated by at least one etch-stop layer;
creating multiple openings from a top surface of said plurality of dielectric layers down into said plurality of dielectric layers by a non-selective etching process, applying a reactive-ion-etching (RIE) lag effect, where depths of the openings depend upon the lateral size of the openings, to cause at least one of said multiple openings to have a depth below said etch-step layer, said at least one of said multiple openings having a uniform width being same above and below said etch-stop layer; and
continuing etching said multiple openings by a selective etching process until one or more openings of said multiple openings that are above said etch-stop layer reach and expose said etch-stop layer.

13. A method comprising:
depositing a plurality of dielectric layers on top of a semiconductor structure, said plurality of dielectric layers being separated by at least one etch-stop layer;
creating multiple openings from a top surface of said plurality of dielectric layers down into said plurality of dielectric layers by a non-selective etching process, applying a reactive-ion-etching (RIE) lag effect, where depth of the openings depend upon the lateral size of the openings, to cause at least one of said multiple openings to have a depth below said etching-stop layer; and continuing etching said multiple openings by a selective etching process until one or more openings of said multiple openings that are above said etch-stop layer reach and expose said etch-stop layer, wherein said at least one of said multiple openings, after said continuing etching said multiple openings, keeps a uniform width that is same above and below said etch-stop layer.

* * * * *